US008276250B2

(12) United States Patent
Wijngaards et al.

(10) Patent No.: US 8,276,250 B2
(45) Date of Patent: Oct. 2, 2012

(54) METHOD OF MANUFACTURING A PIEZOELECTRIC INK JET DEVICE

(75) Inventors: David D. L. Wijngaards, Tegelen (NL); Hans Reinten, Velden (NL); Hendrik J. Stolk, Bergen (NL); Alex N. Westland, Baarlo (NL)

(73) Assignee: Oce-Technologies B.V., Venlo (NL)

( * ) Notice: Subject to any disclaimer, the term of this patent is extended or adjusted under 35 U.S.C. 154(b) by 311 days.

(21) Appl. No.: 12/155,213

(22) Filed: May 30, 2008

(65) Prior Publication Data

US 2008/0295333 A1 Dec. 4, 2008

(30) Foreign Application Priority Data

May 30, 2007 (EP) .................................... 07109198

(51) Int. Cl.
*H01L 41/22* (2006.01)
*B21D 53/76* (2006.01)
*B21P 17/00* (2006.01)

(52) U.S. Cl. ..................................... 29/25.35; 29/890.1

(58) Field of Classification Search ................. 29/25.35, 29/890.1; 347/20, 40, 44–45, 68–70; 310/311, 310/316.01, 317
See application file for complete search history.

(56) References Cited

U.S. PATENT DOCUMENTS 5,242,863 A * 9/1993 Xiang-Zheng et al. ......... 438/53
5,534,903 A * 7/1996 Hayakawa et al. ............. 347/71
5,652,436 A * 7/1997 Stoner et al. .................... 257/77
5,659,346 A * 8/1997 Moynihan et al. .............. 347/68
5,757,400 A * 5/1998 Hoisington ...................... 347/40
6,183,070 B1 * 2/2001 Hashizume ...................... 347/70
6,347,862 B1 * 2/2002 Kanno et al. ..................... 347/68
6,382,292 B1 * 5/2002 Ohmi et al. ................... 156/756
6,382,781 B2 * 5/2002 Furuhata et al. ................ 347/68
6,505,919 B1 * 1/2003 Mizutani ......................... 347/70
6,561,634 B1 * 5/2003 Nishikawa ....................... 347/71
6,779,878 B2 * 8/2004 Higuchi et al. ................. 347/70
6,796,640 B2 * 9/2004 Miyata ............................ 347/71
6,808,254 B2 * 10/2004 Sakaida et al. .................. 347/71
6,911,107 B2 * 6/2005 Kagawa et al. ............... 156/230
6,986,565 B2 * 1/2006 Watanabe et al. ............... 347/71
7,053,526 B2 * 5/2006 Unno et al. ................... 310/324
7,152,963 B2 * 12/2006 Owaki et al. ..................... 347/68
7,448,731 B2 * 11/2008 Murata ........................... 347/68
7,636,993 B2 * 12/2009 Okabe et al. ................. 29/25.35

(Continued)

FOREIGN PATENT DOCUMENTS

EP 0733480 A1 9/1996

(Continued)

*Primary Examiner* — David Angwin
(74) *Attorney, Agent, or Firm* — Birch, Stewart, Kolasch & Birch, LLP

(57) ABSTRACT

A method of manufacturing a piezoelectric ink jet device having a pressure chamber, a flexible membrane delimiting the pressure chamber, a piezoelectric actuator mounted on the membrane, and a rigid substrate attached to the side of the membrane carrying the actuator, which includes the steps of providing the piezoelectric actuator with an electrode on at least one side, attaching the actuator with its electrode side to a carrier plate, bonding the rigid substrate to the side of the carrier plate carrying the actuator, and removing material from the carrier plate on the side opposite to the actuator and leaving only a thin layer of the carrier plate which then forms the membrane.

12 Claims, 5 Drawing Sheets

U.S. PATENT DOCUMENTS

| | | | | |
|---|---|---|---|---|
| 2003/0017712 | A1* | 1/2003 | Brendel | 438/758 |
| 2004/0164650 | A1* | 8/2004 | Xu et al. | 310/328 |
| 2005/0046678 | A1* | 3/2005 | Owaki et al. | 347/68 |
| 2006/0049723 | A1* | 3/2006 | Okabe et al. | 310/348 |
| 2006/0176340 | A1* | 8/2006 | Murata | 347/68 |
| 2007/0052764 | A1* | 3/2007 | Oku | 347/68 |

FOREIGN PATENT DOCUMENTS

| | | | |
|---|---|---|---|
| EP | 1089360 | A1 | 4/2001 |
| EP | 1168465 | A1 | 1/2002 |
| EP | 1708288 | A2 | 10/2006 |
| JP | 2002-234156 | * | 8/2002 |
| JP | 2002234156 | * | 8/2002 |

* cited by examiner

METHOD OF MANUFACTURING A PIEZOELECTRIC INK JET DEVICE

This non-provisional application claims priority under 35 U.S.C. §119(a) on European Patent Application No. 07109198.7 filed in the European Patent Office on May 30, 2007, which is herein incorporated by reference

BACKGROUND OF THE INVENTION

The present invention relates to a method of manufacturing a piezoelectric ink jet device having a flexible membrane a piezoelectric actuator mounted on the membrane, and a rigid substrate (distribution plate) attached to the side of the membrane carrying the actuator, wherein the rigid substrate is bound to a side of a carrier plate carrying the actuator, and material is removed from the carrier plate on the side opposite to the actuator, leaving only a thin layer of the carrier plate which then forms the membrane.

The ink jet device is used in an ink jet printer for expelling an ink droplet in response to an electric signal energizing the piezoelectric actuator. The actuator, when energized, causes the membrane to flex into the pressure chamber, so that the pressure of liquid ink contained in that chamber is increased and an ink droplet is ejected from a nozzle that communicates with the pressure chamber.

In a typical ink jet printer, the ink jet device takes the form of an array of a large number of nozzles and actuator units, where the nozzles are arranged with a very small pitch so as to achieve a high resolution of the printer. As a result, a manufacturing process is required which permits a high nozzle density of the ink jet device. Since the membrane and the actuator are subject to mechanical strains that vary with high frequency, the membrane must firmly and reliably be connected with both the actuator and the rigid substrate.

In a known manufacturing process, the membrane is secured at the substrate by anodic bonding. This, however, has the drawback that the actuator cannot be attached to the membrane prior to anodic bonding. Further, when the actuator is secured on the relatively thin flexible membrane, there is a considerable risk of damage.

US 2006/0049723 A1 discloses a method of the type indicated above, wherein the carrier plate includes a porous layer which separates the membrane from the rest of the plate, and the material is removed by mechanically destroying the porous layer.

US 2005/0046678 A1 discloses an ink jet device and a manufacturing process wherein electrode layers and piezoelectric layers forming the individual actuators are successively formed and patterned on the membrane.

US 2006/0176340 A1 discloses a manufacturing process for an ink jet device that is composed of a number of plate-like components that are stacked one upon the other and bonded together, one of the components being the membrane with the actuators formed thereon. The membrane and the various layers of the actuators are successively formed on a surface of a glass plate that has been coated with an adhesive layer and into which a plurality of through-holes have been created. A wiring pattern for electrically contacting the actuators is formed on a rigid substrate that constitutes another component of the device. These components are then bonded together. The adhesive layer on the glass plate is dissolved by means of a solvent that penetrates through the holes in the glass plate, so that the glass plate may be removed, leaving the actuators and the membrane attached to the substrate component.

SUMMARY OF THE INVENTION

It is an object of the present invention to provide a more reliable and efficient manufacturing process. In order to achieve this object, the manufacturing process according to the present invention provides the piezoelectric actuator with an electrode on at least one side with the actuator then being attached with its electrode side to the carrier plate, and the material of the carrier plate is removed by etching.

This method has the advantage that the piezoelectric actuator or actuators can be prepared in advance and may then be bonded to the membrane. In this bonding step, however, the membrane still forms part of a relatively thick carrier plate which has a high stability, so that the actuators can be securely mounted thereon without any risk of damage. When the carrier plate with the actuators mounted thereon has been bonded to the rigid substrate, the membrane is brought to the desired thickness by etching away material from the opposite side of the carrier plate.

Since the steps of bonding the actuators to the membrane and bonding the membrane to the rigid substrate are performed in a state in which the membrane is still a relatively thick plate, the bonding processes are robust and can be performed reliably and with a high yield. Moreover, the actuators may easily be connected to electronic components, for instance, for controlling the same. To this end, electrical leads and/or electronic components may be formed on or in the surface of the membrane that faces the actuators. Finally, in the condition where the membrane is brought to the desired thickness by removing material of the carrier plate on the side opposite to the actuators, the membrane part of the carrier plate is securely attached to the rigid substrate so that the material of the plate can be removed safely and in a well controlled manner.

In a particularly preferred embodiment, the carrier plate is formed by an SOI wafer (Silicon On Insulator) with a relatively thin silicon layer forming the desired membrane, with an insulating silicon dioxide layer serving as an etch stop, and another silicon layer forming the bulk of the carrier plate that will later be etched away.

Electronic components for reading out or controlling the actuators may be formed directly in the silicon layer that will later form the membrane. Electrical leads and electrodes for contacting the electronic components and the actuators may be formed on the surface of that layer, that has been covered by an insulating layer.

Preferably, the piezoelectric actuators, which are already provided with at least one electrode, are attached to the carrier plate by means of an adhesive, preferably by thermocompression bonding. This is possible thanks to the high mechanical and thermal stability of the carrier plate. In the thermocompression bonding step, the electrode formed on the actuator may be brought into contact automatically with an electrode layer on the membrane, so that the bonding step assures not only a high mechanical stability but also a good and reliable electrical contact.

The method according to the present invention may be performed on wafer scale for producing simultaneously, not only a complete array of nozzle and actuator units, but even a plurality of such arrays which may then be separated from another by dicing the wafer or wafers.

The rigid substrate may be formed by another silicon wafer which is suitably etched to form chambers accommodating the individual actuators, ink supply channels, feedthroughs and the like.

The piezoelectric actuators of a complete array or even a complete wafer may be prepared simultaneously by providing at least one electrode on a piezoelectric slab of suitable size and then separating the individual actuators from one another by cutting grooves into the surface of the piezoelectric layer that carries the electrode. The actuators, which still form part of an integral piezoelectric body, are then bonded to the carrier plate, and then the actuators are separated from one another by grinding away the continuous top portion of the piezoelectric material.

Another electrode layer will then be formed on the top surfaces of the actuators. At the same time, electrical leads for contacting these top electrodes may be formed directly on the surface of the carrier plate. Preferably, before forming the top electrodes, the peripheral portions of the piezoelectric actuators are covered by a ring of insulating material for insulating the side faces of the piezoelectric layer and for reliably separating and insulating the top and bottom electrodes of the actuator from one another.

BRIEF DESCRIPTION OF THE DRAWINGS

Preferred embodiments of the present invention will now be described in conjunction with the drawings, wherein.

DETAILED DESCRIPTION OF THE INVENTION

Figure 1:
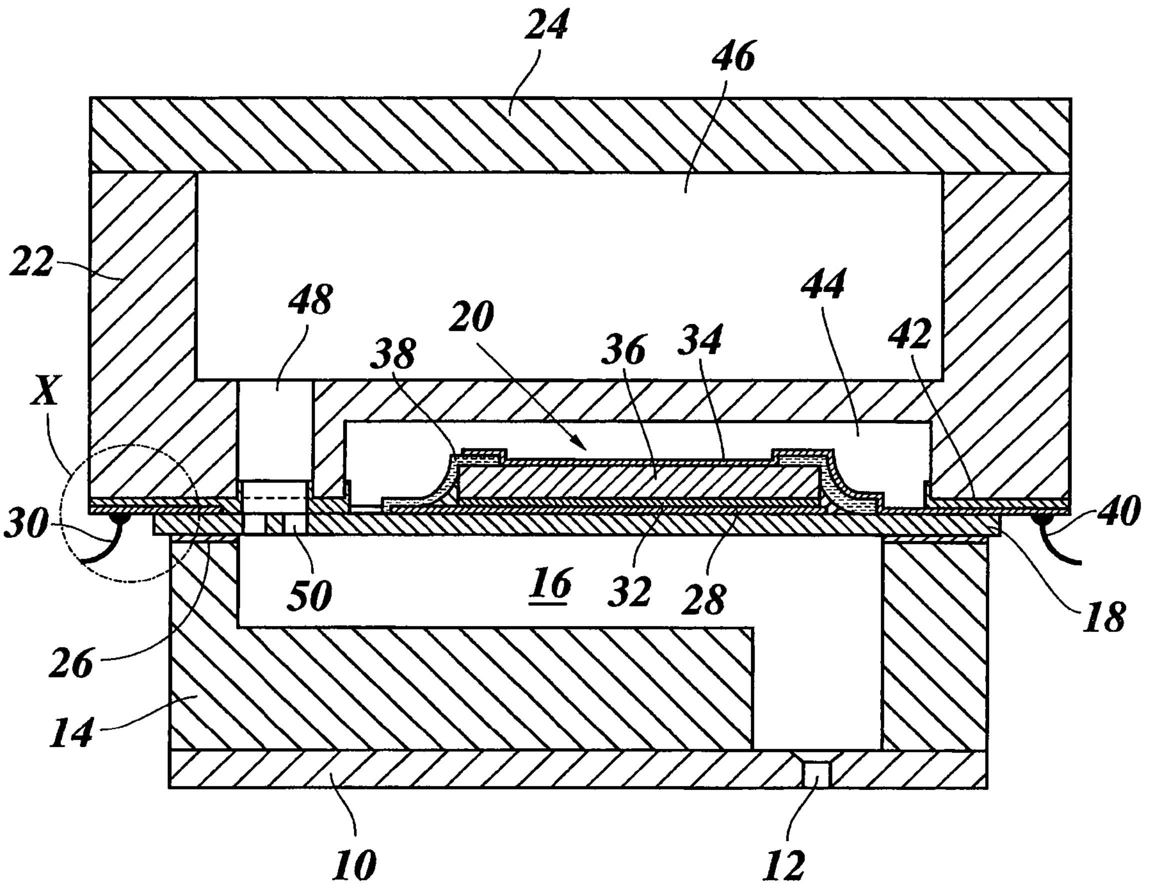
FIG. 1 is a cross-sectional view of an individual ink jet device manufactured by the method according to the present invention.

As is shown in FIG. 1, an ink jet device according to the invention has a layered structure comprising, from the bottom to the top in FIG. 1, a nozzle plate 10 with a nozzle 12 formed therein, a chamber plate 14 defining a pressure chamber 16 that communicates with the nozzle 12, a flexible membrane 18 carrying a piezoelectric actuator 20, a distribution plate 22 for supplying liquid ink to the pressure chamber 16, and an optional cover plate 24.

The chamber plate 14, the membrane 18 and the distribution plate 22 are preferably made of silicon, so that etching and photolithographic techniques known from the art of semiconductor processing can be utilized for reliably and efficiently forming minute structures of these components, preferably from silicon wafers. While FIG. 1 shows only a single nozzle and actuator unit, it is possible and preferable that an entire chip comprising a plurality of nozzle and actuator units, or a plurality of such chips, are formed in parallel by wafer processing. The use of identical, respectively similar materials for the above components has the further advantage that problems resulting from differential thermal expansion of the components can be avoided or effectively minimized.

The flexible membrane 18 is securely bonded to the chamber plate 14 by means of an adhesive layer 26 so as to cover the pressure chamber 16 and to define a top wall thereof. An electrically conductive structure 28 is formed on the top surface of the membrane and may be led out on at least one side, so that it may be in electrical contact with a wire bond 30, for example.

The piezoelectric actuator 20 comprises a bottom electrode 32 held in intimate large-area contact with the electrically conductive structure 28, a top electrode 34, and a piezoelectric layer 36 sandwiched therebetween. The piezoelectric layer 36 may be made of a piezoelectric ceramic such as PZT (Lead Zirconate Titanate) and may optionally contain additional internal electrodes.

The peripheral edge of the top surface of the piezoelectric layer 36 as well as the lateral surfaces of that layer are covered by an insulating layer 38. The peripheral portion of the top electrode 34 is superimposed on the insulating layer 38 and is led out to one side on the surface of the membrane 18, so that it may be in electrical contact with a wire bond 40.

At the locations where the electrical contacts, such as wire-bonds 30 and 40, are made, the electrical leads are secured to the distribution plate 22 by means of another adhesive layer 42 that is also used to securely attach the top surface of the membrane 18 to the distribution plate.

It is observed that the bottom electrode 32 and preferably also the top electrode 34 of the actuator cover the entire surface of the piezoelectric layer 36, including the edge portions thereof, which contributes to an increase in power gain and volume displacement of the actuator. The insulating layer 38 reliably prevents the top and bottom electrodes from becoming short-circuited and also assures that the electrodes are separated everywhere by a sufficient distance, so that, when a voltage is applied to the electrodes, the strength of the electric field established therebetween will reliably be limited to a value that is not harmful to the piezoelectric material.

The distribution plate 22 is securely bonded to the top surface of the membrane 18 by means of adhesive layer 42 and defines a chamber 44 that accommodates the actuator 20 with sufficient play so as not to obstruct the piezoelectric deformation of the actuator. The actuator 20 will thus be shielded not only from the ink in the pressure chamber 16 and in the supply system but also from ambient air, so that a degradation of the actuator due to ageing of the piezoelectric material is minimized.

The chamber 44 may be filled with a gas such as nitrogen or argon that does not react with the piezoelectric material, or may be evacuated or held under a slight sub-atmospheric pressure. If, in another embodiment, the chamber 44 contains air at atmospheric pressure, it preferably communicates with the environment through a restricted vent hole, so that the pressure in the chamber may be balanced with the atmospheric pressure, but the exchange of air is restricted so as to avoid ageing of the piezo.

Above the actuator chamber 44 and separated therefrom, the distribution plate 22 defines a wide ink supply channel 46 that is connected, at at least one end thereof, to an ink reservoir (not shown). Optionally, the ink reservoir may be provided directly on top of the ink channel 46 in place of the cover plate 24.

In a position laterally offset from the actuator chamber 44, the distribution plate 22 defines a feedthrough 48 that connects the ink supply channel 46 to the pressure chamber 16 via a filter passage 50 formed by small perforations in the membrane 18. The filter passage 50 prevents impurities that may be contained in the ink from entering into the pressure chamber 16 and at the same time restricts the communication between the ink supply channel 46 and the pressure chamber 16 to such an extent that a pressure may be built up in the pressure chamber 16 by means of the actuator 20. To that end, the piezoelectric layer 36 of the actuator deforms in a flexural mode when a voltage is applied to the electrodes 32, 34.

When an ink droplet is to be expelled from the nozzle 12, the actuator is preferably energized with a first voltage having such a polarity that the piezoelectric layer 36 bulges away from the pressure chamber 16 and thus deflects the membrane 18 so as to increase the volume of the pressure chamber. As a result, ink will be sucked in through the filter passage 50. Then, the voltage is turned off, or a voltage pulse with opposite polarity is applied, so that the volume of the pressure chamber 16 is reduced again and a pressure wave is generated in the liquid ink contained in the pressure chamber. This pressure wave propagates to the nozzle 12 and causes the ejection of the ink droplet.

The above-described construction of the ink jet device, with the ink supply channel 46 being formed on top of the pressure chamber 16 (and on top of the actuator 20) has the advantage that it permits a compact configuration of a single nozzle and actuator unit and, consequently, permits a high integration density of a chip formed by a plurality of such units. As a result, a high nozzle density can be achieved for high resolution and high speed printing. Nevertheless, the device may be produced in a simple and efficient manufacturing process that is particularly suited for mass production. In particular, the electrical connections and, optionally, electrical components 52 can easily be formed at one side of the membrane 18 before the same is assembled with the distribution plate 22.

It will be understood that the metal layer forming the ground electrode 32 (or, alternatively, an electrode for energizing the actuator) is led out in a position offset from the filter passage 50 in the direction normal to the plane of the drawing in FIG. 1 or is formed around that filter passage.

Figure 2:
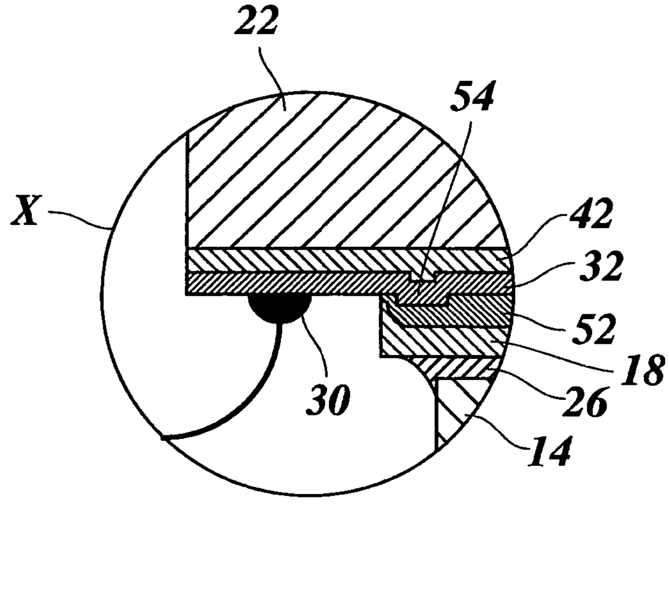
FIG. 2 is an enlarged detail of the device shown in FIG. 1.
Figure 3:
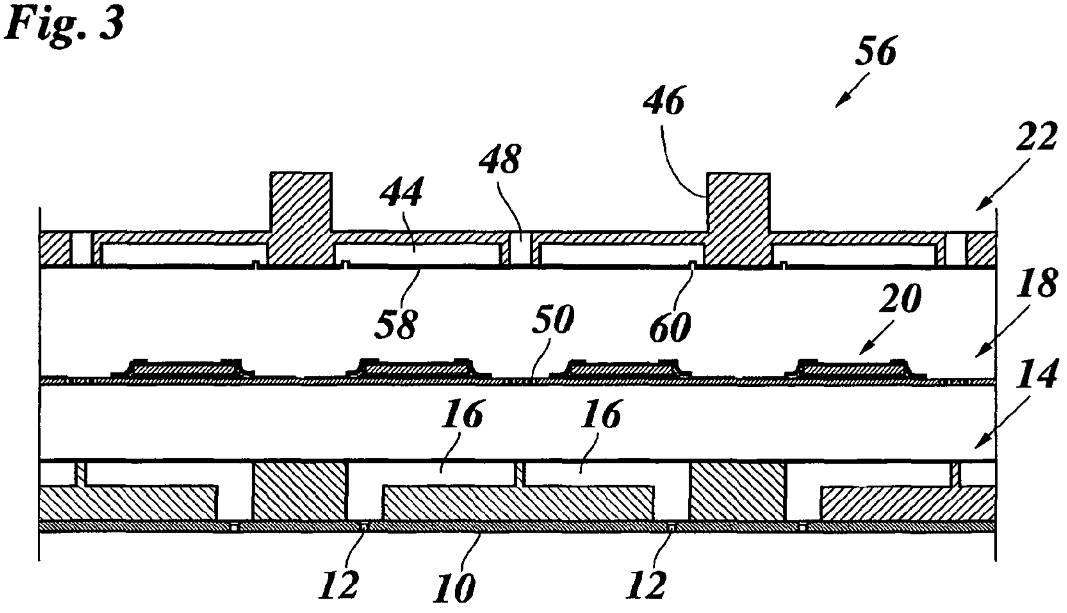
FIG. 3 is a partial sectional view of components of an ink jet device forming an array of a plurality of nozzle and actuator units.

FIG. 2 is an enlarged view of a detail that has been marked by a circle X in FIG. 1. In the example shown, part of an electronic component 52, e.g., a sensor or a switching transistor or driving circuit for controlling the actuator 20, has been embedded in the top surface of the membrane 18 by suitably doping the silicon material. Further, in that example, an extension or tab of the electrode 32 forms a reliable connection with the electronic component 52 through an opening 54 in the dielectric layer 51 on the surface of the membrane FIG. 3 illustrates a chip 56 comprising a plurality of nozzle and actuator units that are constructed in accordance with the principles that have been described in conjunction with FIG. 1. Here, the main components of the chip, i.e., the chamber plate 14, the membrane 18 with the actuators 20, and the distribution plate 22, have been shown separated from one another for reasons of clarity.

In this example, the pressure chambers 16 are alternatingly arranged and rotation-symmetrically disposed, so that pairs of these chambers may be supplied with ink from a common channel 46 and a common feedthrough 48. The filter passages 50 for each pressure chamber 16 are arranged above an end portion of the respective pressure chamber 16 opposite to the end portion that is connected to the nozzle 12. This has the advantage that the pressure chambers may be flushed with ink so as to remove any air bubbles that might be contained therein and would be detrimental to the droplet generation process.

The chip 56 shown in FIG. 3 forms a two-dimensional array of nozzle and actuator units with a plurality of such units being aligned in the direction normal to the plane of the drawing in FIG. 3. In the example shown, each actuator 20 is accommodated in an individual chamber 44 that is separated from adjacent chambers by transverse walls 58 formed integrally with the distribution plate 22. As mentioned above, these chambers may communicate via restricted vent holes 60. As an alternative, the transverse walls 58 may be dispensed with, so that the actuators 20 aligned in a same column are accommodated in a common, continuous chamber 44.

Figure 4:
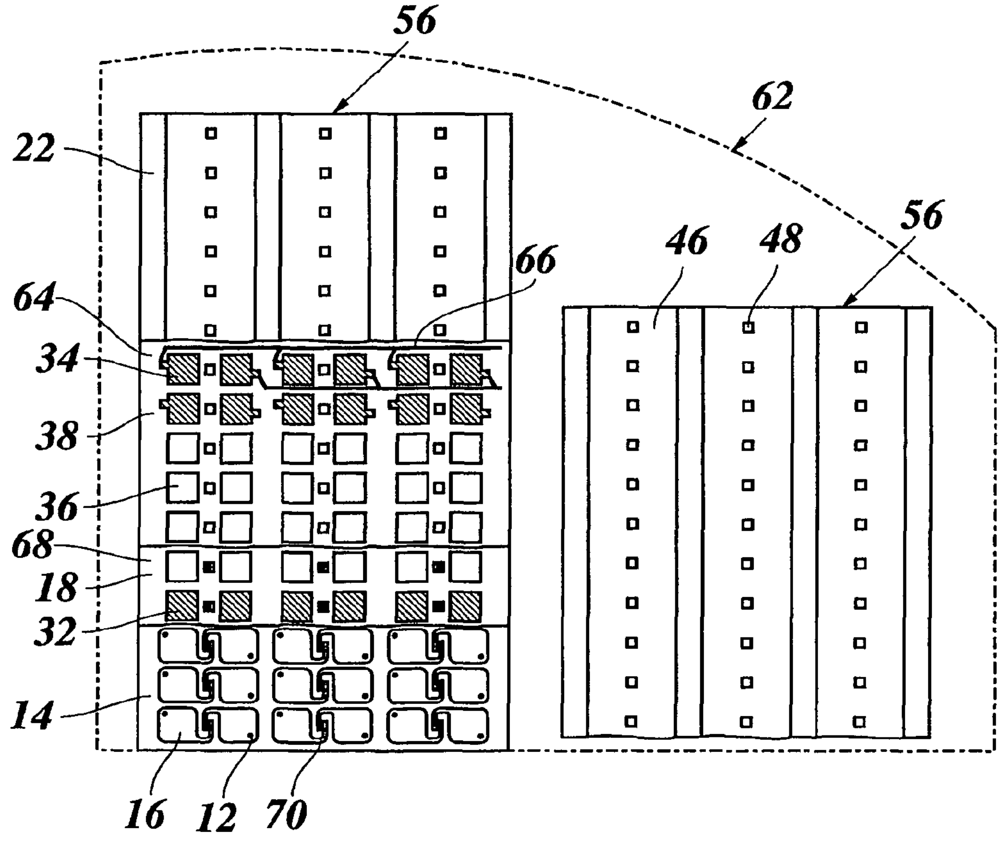
FIG. 4 is a partial plan view of arrays of the type shown in FIG. 3, as manufactured from a wafer.

Each of the membrane 18, the distribution plate 22, and, optionally, the chamber plate 14 may be formed by processing a respective wafer 62, as has been indicated in FIG. 4. The components of a plurality of chips 56 may be formed of a single wafer. What has been illustrated for the chip 56 shown on the right side in FIG. 4, is a top plan view of the distribution plate 22 with the ink supply channels 46 and feedthroughs 48. The chip on the left side in FIG. 4 has been shown partly broken away, so that the layer structure of the chip is visible.

A layer 64 directly underneath the distribution plate 22 shows five rows of actuators. The first two rows show top plan views of the top electrodes 34 with their projected leads. In this embodiment, the entire surface of the membrane 18, except the areas of the electrodes 34 and the areas coinciding with the feedthroughs 48, is covered by the insulating layer 38, as will later be explained in detail in conjunction with FIGS. 14 to 16. The first row in FIG. 4 shows also electrical tracks 66 connected to the leads and provided on the surface of the insulating layer 38. The last three rows in the layer 64 show the piezoelectric layers 36 without top electrodes.

In the next layer 68, the insulating layer 38 has been removed so that the membrane 18 with the filter passages 50 becomes visible. In the second row of this layer, the piezoelectric layers 36 have also been removed so as to illustrate the bottom electrodes 32.

The lowermost three rows of the chip show a top plan view of the chamber plate 14 with the pressure chambers 16 and the nozzles 12. In this example, the filter passages communicate with the pressure chambers 16 via labyrinths 70. These labyrinths serve to provide for a sufficient flow restriction. As shown, the pressure chambers 16 have an approximately square shape, and the labyrinth opens into the corner of the chamber that is diagonally opposite to the nozzle 12.

Preferred embodiments of the present method for producing the ink jet device and the chip 56, respectively, will now be described.

FIGS. 5 to 13 illustrate a method of forming the membrane 18 with the actuators 20.

Figure 5:
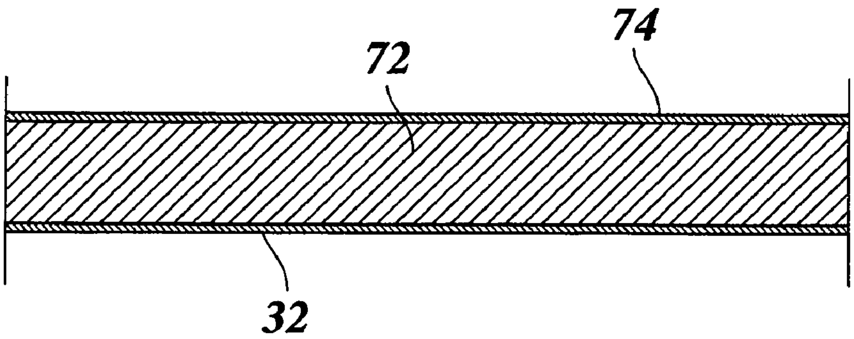
FIGS. 5-8 illustrate several steps of a method for preparing and mounting piezoelectric actuators on a membrane.

First, as is shown in FIG. 5, a slab 72 of piezoelectric material is prepared and is provided with the bottom electrode 32 and another electrode 74 on the top surface. These electrodes may be used for polarizing the piezoelectric material. The slab 72 should preferably have at least the size of an entire chip 56 which. If available, a slab of wafer size could be used, or a plurality of slabs may be attached with their electrodes 74 to a wafer-size carrier plate. The thickness of the slab 72 may, for example, be in the range from 200 to 500 μm.

Figure 6:
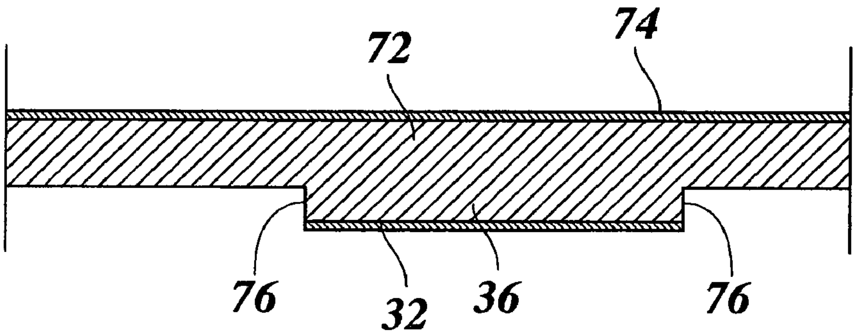

As is shown in FIG. 6, grooves 76 are cut into the bottom side of the slab 72 to a depth slightly larger than the intended thickness of the piezoelectric layer 36 of the actuator. Although not shown in the drawings, the grooves 76 extend cross-wise, thus leaving projecting platforms that will later form the piezoelectric layers 36 covered by the bottom electrodes 32. The pattern of these platforms corresponds to the intended array of actuators on the chip 56.

Figure 7:
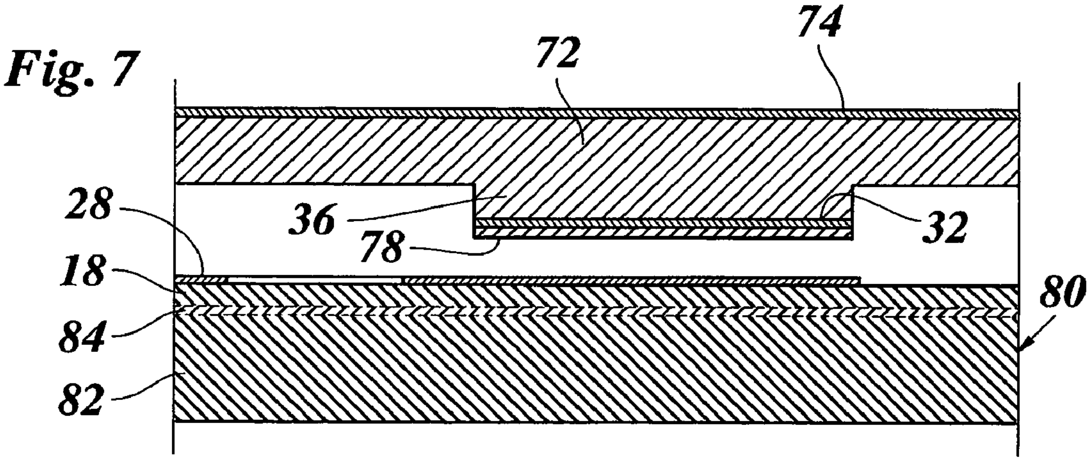

As is shown in FIG. 7, the bottom side of the bottom electrode 32 is covered with an adhesive layer 78, e.g., by tampon printing, roller coating, spray coating or the like. Further, a wafer-size carrier plate 80 is prepared, and the electrically conductive structure 28 is formed with a suitable pattern on the top surface thereof. The carrier plate 18 is preferably formed by an SOI wafer having a top silicon layer which will later form the membrane 18, a bottom silicon layer 82 that will later be etched away, and a silicon dioxide layer 84 separating the two silicon layers and serving as an etch stop.

In a practical embodiment, the top silicon layer and hence the membrane 18 may have a thickness between 1 μm and 25 μm, or about 10 μm, the etch stop has a thickness of 0.1 to 2 μm and the bottom silicon layer 82 may have a thickness of between 150 and 1000 μm, so that a high mechanical stability is assured.

The slab 72 is then pressed against the top surface of the carrier plate 80, and the bottom electrodes 32 of the intended actuators are firmly bonded to the conductive structures 28 by thermocompression bonding. In this process, as has been shown in FIG. 8, the adhesive layer 78 will be squeezed out and will form a meniscus around the periphery of each piezoelectric layer 36, while the conductive structures 28 and electrodes 32 are brought into electrical contact with one another. Since the piezoelectric material of the slab 72 will typically have pyroelectric properties, it is convenient to short-circuit the electrodes 32 and 74 during the thermocompression bonding process in order to avoid electrical damage. Alternatively instead of thermocompression bonding ultrasonic bonding may be used where instead of an adhesive layer a gold layer or gold bumps are provided on the bottom electrodes of the intended actuators and/or on the ground electrodes.

Figure 8:
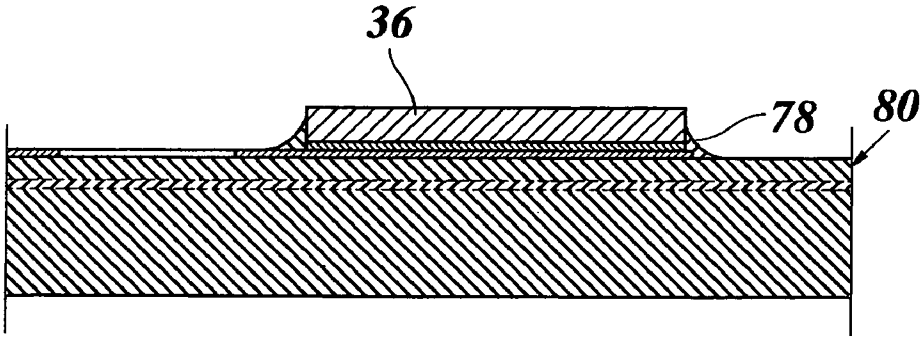

As is shown in FIG. 8, the electrode 74 and the continuous top portion of the slab 72 are removed, e.g., by grinding, so that only the desired array of piezoelectric layers 36 of the actuators is left on the carrier plate 80.

Figure 9:
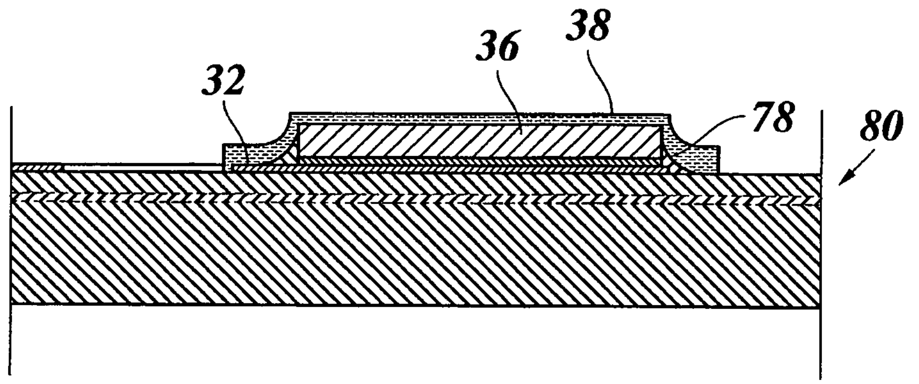
FIGS. 9-11 illustrate several steps of a method for completing the actuators on the membrane.

As is shown in FIG. 9, the next step is to form the insulating layer 38. This layer is formed, e.g., by spin coating, spray coating, sputtering PVD, CVD or the like, at least on the entire surface of the piezoelectric layer 36, on the side walls thereof and on the meniscus formed by the adhesive layer 78, respectively. The insulating layer 38 is preferably formed by a photo-curable epoxy resin such as SU8 or BCB. The portions of the layer 38 that are to be retained are exposed with light so as to cure the resin, and the non-exposed portions are removed.

Figure 10:
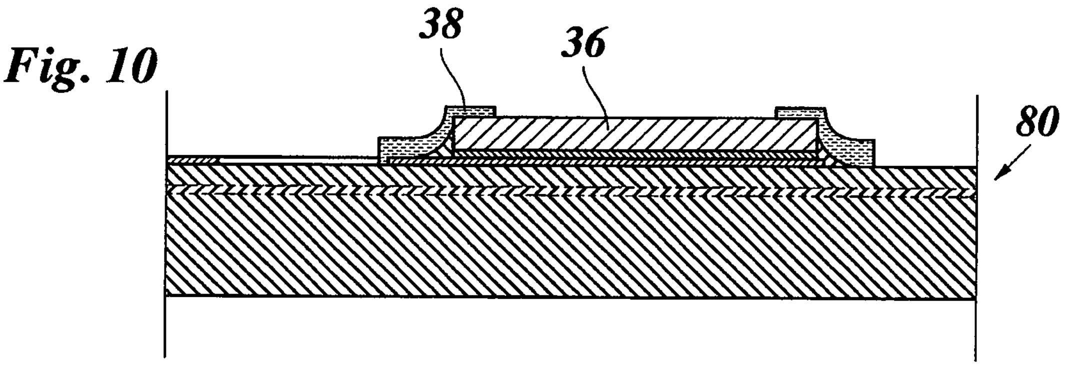

As is shown in FIG. 10, the layer 38 is removed at least from the central portion of the insulating layer 36 where the top electrode 34 is to be applied.

Figure 11:
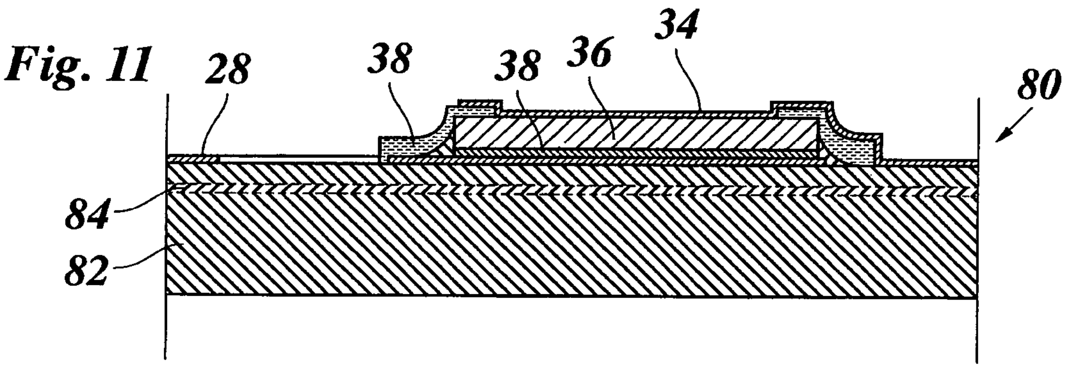

As is shown in FIG. 11, the top electrode 34 is formed on the exposed top surface of the piezoelectric layer 36, e.g., by sputtering or any other suitable process. In order to be able to electrically contact the top electrode, this electrode is extended on at least one side over the insulating layer 38 and onto the top surface of the carrier plate 80, as is shown on the right side in FIG. 11. The insulating layer 38 assures that the metal of the top electrode 34 is reliably kept away, by a sufficient distance, from the bottom electrode 32 and the conductive structures 28, so as to avoid short circuits and to limit the strength of the electric field developed between the electrodes.

The step shown in FIG. 11 completes the formation of the piezoelectric actuators 20.

Figure 12:
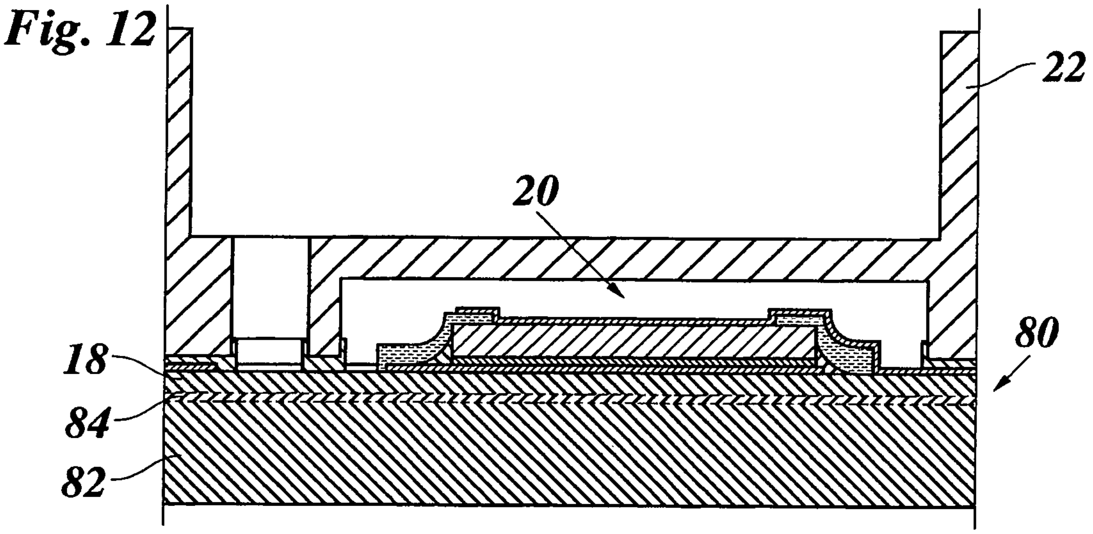
FIG. 12 illustrates the step of attaching the membrane to a rigid substrate.

In the next step, shown in FIG. 12, the distribution plate 22 is bonded to the top surface of the carrier plate 80. The distribution plate 22 will be prepared separately by etching a suitable silicon wafer. For example, the relatively coarse structures of the supply channels 46 may be formed in a cost-efficient anisotropic wet etching process, whereas the minute structures of the actuator chambers 44 and feedthroughs 48 may be formed by dry etching from below.

The distribution plate 22 then serves as a rigid substrate that can be used as a handle for manipulating the assembly. The joint wafers forming the distribution plate 22 and the carrier plate 80 are transferred to an etching stage where the lower silicon layer 82 of the carrier plate 80 is etched away up to the etch stop formed by the silicon oxide layer 84. The silicon oxide layer is subsequently removed, which leaves only the thin, flexible membrane 18 with the actuators 20 mounted thereon and firmly secured to the rigid distribution plate 22.

Figure 13:
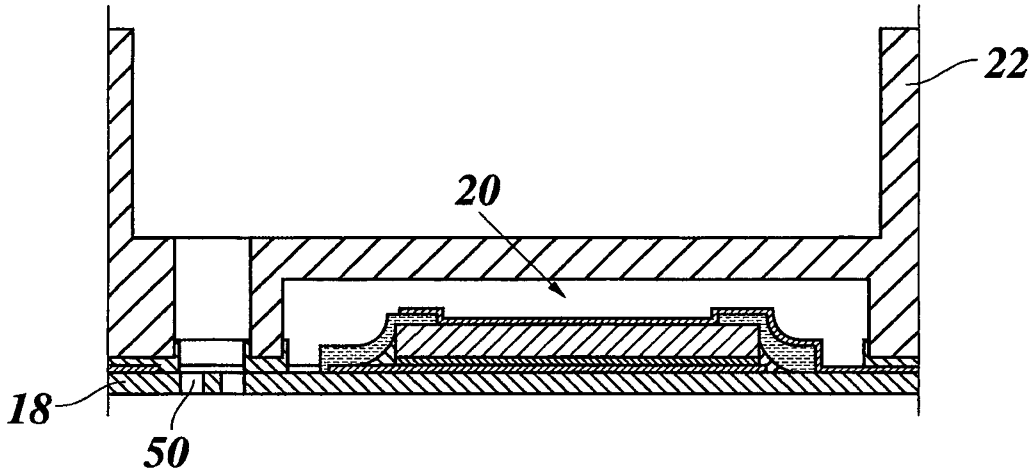
FIG. 13 illustrates the step of releasing the membrane.

The filter passages 50 may be formed in the same or in a separate etching step, e.g., using the patterned silicon oxide layer as a hard mask or by using a photoresist mask, or by any other process such as laser cutting. The result is shown in FIG. 13.

Since the flexible membrane 18 is backed by the distribution plate 22, it may safely be handled in the further processing steps which include bonding the membrane 18 to the chamber plate 14. If, in this stage, the assembly of the membrane 18 and the distribution plate 22 on the one side and the chamber plate 14 on the other side have wafer size, the actuators 20 and filter passages 50 may accurately be aligned with the pressure chambers 16 for all the chips on the wafers in a single alignment step. Finally, the joint wafers will be diced to form the individual chips 56.

As an alternative, it is of course possible to dice only the joint wafers forming the membrane 18 and the distribution plate 22 and to assemble them with the separate chamber plates 14.

In the example shown in FIGS. 9-13, the insulating layer 38 has a relatively small thickness on the top side of the piezoelectric layer 36 and a larger thickness on the surface of the membrane and the electrically conductive structures 28, respectively. For comparison, FIG. 1 illustrates an embodiment where the insulating layer 38 has a uniform thickness.

Figure 14:
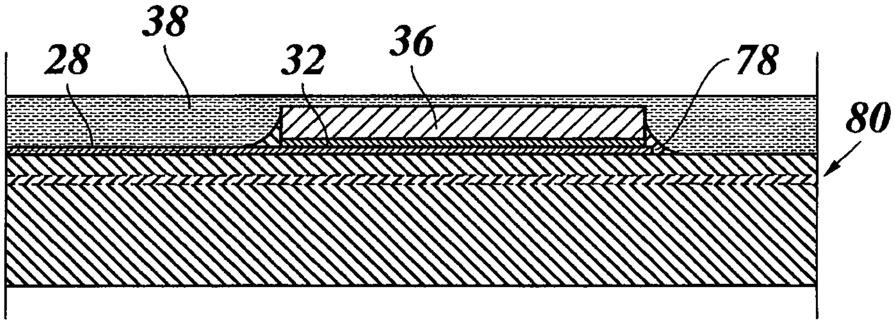
FIGS. 14-16 illustrate steps analogous to FIGS. 9-11 for a modified embodiment of the invention.

FIG. 14 illustrates yet another embodiment, wherein the step of FIG. 9 is modified in that the insulating layer 38 is formed on the entire surface of the carrier plate 80 with a flat, continuous top surface, i.e., the piezoelectric layers 36, the bottom electrodes 32, and the electrically conductive structures 28 are entirely buried in the insulating layer 38. This embodiment corresponds to the example shown in FIG. 4.

Figure 15:
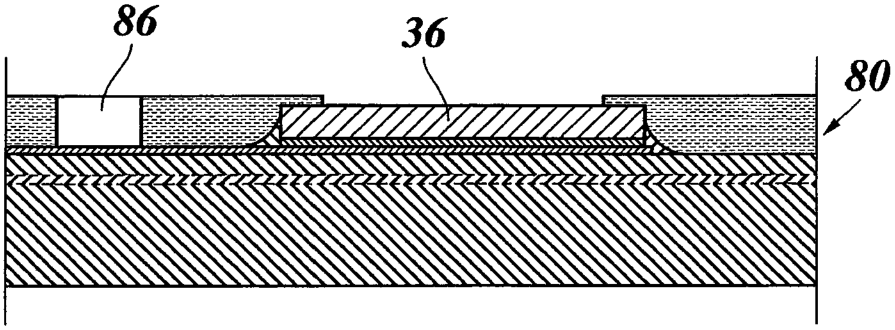

Again, as is shown in FIG. 15, the photo-curable insulating layer 38 is exposed, and the resin is removed at least in the portions covering the piezoelectric layers 36 and portions 86 coinciding with the feedthroughs 48.

Figure 16:
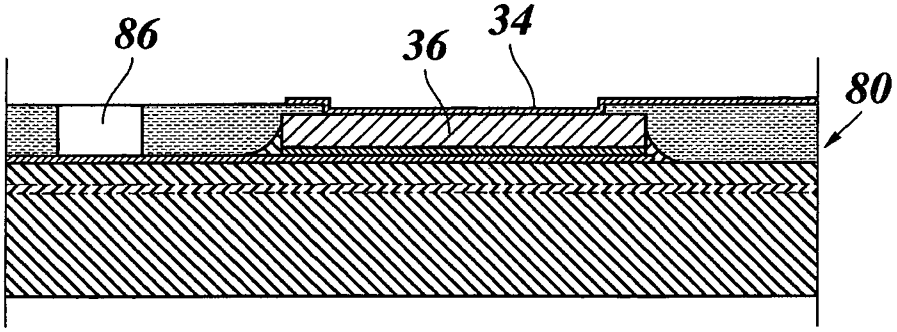

Finally, as is shown in FIG. 16, the top electrodes 34 of the actuators are applied and extended on the flat top surface of the insulating layer 38. Depending on the procedures employed for electrically contacting the actuators, this may facilitate the formation of the electrical contacts. The rest of the procedure corresponds to that explained in conjunction with FIGS. 9 to 12.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. A method of manufacturing a piezoelectric ink jet device having, a flexible membrane, a piezoelectric actuator mounted on the membrane, and a rigid substrate attached to a side of the membrane carrying the piezoelectric actuator which comprises the steps of:

bonding the rigid substrate to a side of a carrier plate carrying the piezoelectric actuator;

removing material from the carrier plate on a side opposite to the piezoelectric actuator and leaving only a thin layer of the carrier plate which then forms the membrane; and bonding a joint structure of the rigid substrate and the membrane with the piezoelectric actuator to a chamber plate in which a pressure chamber is formed, such that the actuator is opposed to the pressure chamber on the other side of the membrane, and the membrane is between the actuator and pressure chamber, wherein the piezoelectric actuator is provided with an electrode on at least one side, then the actuator is attached with its electrode side to the carrier plate, and removing material from the carrier plate is done by etching, and wherein the rigid substrate is a distribution plate which defines an ink supply system and a chamber for accommodating the piezoelectric actuator.

2. The method according to claim 1, wherein the carrier plate is an SOI wafer, and an oxide layer of that wafer is used as an etch stop.

3. The method according to claim 1, further comprising forming the distribution plate by structuring a silicon wafer.

4. The method according to claim 3, wherein the carrier plate is an SOI wafer, and an oxide layer of that wafer is used as an etch stop.

5. The method according to claim 1, comprising a plurality of piezoelectric actuators for at least one chip having a plurality of nozzle and actuator units that are formed on a common wafer.

6. The method according to claim 5, wherein distribution plates of said at least one chip are formed on a common wafer and the wafers forming the distribution plates and the carrier plates are bonded together before they are separated into individual chips.

7. The method according to claim 6, wherein the carrier plate is an SOI wafer, and an oxide layer of that wafer is used as an etch stop.

8. The method according to claim 1, wherein the actuator is attached to the carrier plate by thermocompression bonding.

9. The method according to claim 8, wherein the piezoelectric actuator, in the state in which it is attached to the carrier plate, is provided with electrodes on both sides, and these electrodes are short-circuited during thermocompression bonding.

10. The method according to claim 7, wherein the carrier plate is an SOI wafer, and an oxide layer of that wafer is used as an etch stop.

11. The method according to claim 1, wherein piezoelectric layers for a plurality of piezoelectric actuators are formed by cutting grooves into a common slab of piezoelectric material on the side carrying said at least one electrode of the piezoelectric actuator, which slab is mounted on the carrier plate, and the piezoelectric layers of the piezoelectric actuators are separated from one another by removing a continuous top portion of the slab.

12. The method according to claim 9, wherein the carrier plate is an SOI wafer, and an oxide layer of that wafer is used as an etch stop.

* * * * *